(12) United States Patent
Aiello (10) Patent No.: US 9,384,093 B1
(45) Date of Patent: Jul. 5, 2016

(54) RAID ENABLED NVME DEVICE

(71) Applicant: PMC-SIERRA US, INC., Sunnyvale, CA (US)

(72) Inventor: Anthony Frank Aiello, Santa Clara, CA (US)

(73) Assignee: MICROSEMI STORAGE SOLUTIONS (U.S.), INC., Aliso Viejo, CA (US)

( * ) Notice: Subject to any disclaimer, the term of this patent is extended or adjusted under 35 U.S.C. 154(b) by 56 days.

(21) Appl. No.: 14/289,608

(22) Filed: May 28, 2014

(51) Int. Cl.
G11C 29/00 (2006.01)
G06F 11/10 (2006.01)
G06F 3/06 (2006.01)
H03M 13/15 (2006.01)

(52) U.S. Cl.
CPC .......... *G06F 11/1088* (2013.01); *G06F 3/0619* (2013.01); *G06F 3/0656* (2013.01); *G06F 3/0688* (2013.01); *H03M 13/1515* (2013.01)

(58) Field of Classification Search
CPC .......................... G06F 11/1084; G06F 11/108
See application file for complete search history.

(56) References Cited

U.S. PATENT DOCUMENTS

| 2013/0024595 | A1 | 1/2013 | Subramaniyan et al. | |
|---|---|---|---|---|
| 2013/0086311 | A1* | 4/2013 | Huang | G06F 13/1689 711/103 |
| 2014/0337540 | A1* | 11/2014 | Johnson | G06F 13/14 710/5 |
| 2014/0372698 | A1* | 12/2014 | Lee | G06F 12/0253 711/114 |
| 2015/0012607 | A1* | 1/2015 | Cayton | H04L 67/1095 709/212 |
| 2015/0032936 | A1* | 1/2015 | Yu | G06F 12/0246 711/103 |
| 2015/0095554 | A1* | 4/2015 | Asnaashari | G06F 12/0246 711/103 |
| 2015/0169021 | A1* | 6/2015 | Salessi | G06F 1/266 713/300 |

FOREIGN PATENT DOCUMENTS

WO 2013142667 A1 9/2013

OTHER PUBLICATIONS

Intel, NVM express Revision 1.0e, Jan. 23, 2013, Intel, pp. 1-127.*
Marvell Semiconductor Inc., "Native PCIe Gen 2.0 x1 NAND Flash Controller", 88NV9145-002 product brief Dec. 2011, pp. 1-2, Santa Clara, California, US.
Shimpi, "Micron P320h PCIe SSD (700GB) Review", ANANDTECH, http://www.anandtech.com/show/6371/micron-p320-pcie-ssd-700gb-review-first-nvme-ssd, published online Oct. 15, 2012, pp. 1-14.

* cited by examiner

Primary Examiner — M. Mujtaba K Chaudry
(74) Attorney, Agent, or Firm — Dennis R. Haszko (57) ABSTRACT

A data protection system having a host, a solid-state drive ("SSD") array comprising at least three non-volatile memory express ("NVMe") drives, each NVMe drive comprising a buffer, and a peripheral component interconnect express ("PCIe") data bus interfacing the host and the NVMe drives. The NVMe drives are implemented with commands for implementing a RAID volume in the SSD array, wherein the commands are operable to perform RAID operations at the NVMe drives using the buffers of the NVMe drives.

13 Claims, 9 Drawing Sheets

RAID ENABLED NVME DEVICE

FIELD OF THE DISCLOSURE

The present invention relates generally to electronic data storage systems. More particularly, the present invention relates to data redundancy and error correction in electronic data storage systems.

BACKGROUND

RAID ("redundant array of independent disks") is a well-known storage technology combining multiple disk drive components into a single logical unit in order to provide, among other things, data redundancy and error correction. The term RAID designates a number of methods for creating and maintaining error recovery information. In general, RAID operates on the principle of storing data across a number of different independent drives as well as error recovery data derived from the stored data. Should any one of the drives fail, the data stored thereon can be reconstructed or recovered from the error recovery data and the data stored on the remaining drives using a particular method. In typical implementations, the method may include simple exclusive-or ("XOR") operations or more complex Reed-Solomon codes or even more general erasure codes.

For example, a particular RAID scheme may employ four data drives for storing data, plus a fifth parity drive for storing parity information. The data to be stored in the system may be divided into four segments, with a quarter of the data being stored on each data drive. When the data is stored, parity information, 'P', is determined from the data by calculating the XOR sum of the four data segments, 'A', 'B', 'C', 'D', as follows:

$$A \wedge B \wedge C \wedge D = P \quad (1)$$

Since XOR is fully communicative, the order of presentation of the four data segments is irrelevant, and any particular segment may be determined from the parity information along with the remaining data segments, as follows:

$$A = B \wedge C \wedge D \wedge P \quad (2)$$

This result follows from the fact that anything XOR'ed with itself equals zero.

Updating a single segment consists of removing an old data image and replacing it with a new data image. This is accomplished by recognizing that XOR of parity information, P, with any data segment, e.g. A, removes that data segment from the parity information. In other words, if:

$$A \wedge B \wedge C \wedge D = P \quad (3)$$

then $$P \wedge A = B \wedge C \wedge D \quad (4)$$

again, since anything XOR'ed with itself equals zero. If new data A' is then XOR'ed with parity P, then the resulting parity P' is correct to all segments including A. In other words, generating new parity P' is done as follows:

$$P' = P \wedge A \wedge A' \quad (5)$$

This expression may be verified by substituting $P \wedge A$ with $B \wedge C \wedge D$, yielding:

$$P' = B \wedge C \wedge D \wedge A' \quad (6)$$

which is expected based on the original form of Equation (1) above. In general, data update is carried out according to Equation (5) instead of Equation (6) as the former is more efficient as it requires fetching only the data member being updated along with the parity member.

As is known in the art, parity information comprising XOR sums is but one example of a more general class of erasure codes, which also includes XOR sums computed using Galois fields, Reed-Solomon codes, and specialized versions of these such as Cauchy-Reed-Solomon and Vandermonde-Reed-Solomon codes. In all such methods, an original message is transformed into a longer message whereby the original message can be calculated from a subset of the longer message.

Erasure codes allow for recovery from n failures by encoding n error correction codes for k symbols of data. The total of space needed then is n+k. In essence, erasure codes employ the principle that if there are no more than n unknowns a unique solution can be obtained because there are n equations. As long as the number of equations is greater than or equal to the number of unknowns, linear algebraic methods can be used to solve for any set of unknowns.

In general, a RAID system has three requirements, as follows.

Firstly, a RAID implementation requires transactional controls. RAID operations produce coherent updates to discrete devices by insuring that said updates are performed in isolation. Should coordination of updates break down, then stored erasure codes cannot be guaranteed to be correct with respect to the data.

Secondly, the implementation must enable the discrete operations themselves. RAID performs a series of algebraic functions to create and maintain erasure codes.

Thirdly, the implementation must provide some space for the RAID operations. Some scratchpad buffers are necessary to work through the creation and maintenance of erasure codes.

In view of the requirements, RAID has been implemented primarily with a specialized controller. The controller, in addition to providing translation from host to device protocols, provides transactional controls and memory space for RAID operations.

The provision and use of a RAID controller requires, however, the expenditure of resources, and further complicates and retards data throughput between the storage drives and a host accessing the RAID system. It would be desirable, therefore, to provide a RAID implementation which does not require a separate controller, but which provides all of the necessary functionality.

BRIEF DESCRIPTION OF THE DRAWINGS

Embodiments of the present invention will now be described, by way of example only, with reference to the attached drawings, as follows.

DETAILED DESCRIPTION

A data protection system, such as a RAID implementation, which does not require a separate controller, may be implemented by using a plurality of NVMe ("non-volatile memory express") interfaced devices. This desired result is enabled in part by employing characteristics of the NVMe controller, some related to the NVMe protocol, and some implemented in the controller specifically for the present purpose. The result is a combined implementation of software and firmware to create a storage subsystem capable of performing complex data protection functions such as RAID 4, 5, or 6 and erasure codes generally.

NVMe is a specification for accessing solid-state drives ("SSD's") interfaced via a PCI Express ("PCIe") data bus. Unlike typical storage drives which require a controller to implement a discrete transaction protocol, NVMe enables the presentation of drive resources directly to the system via mapping the drive in an existing PCIe address space. Using the PCI protocol, the NVMe device presents a memory mapped region to the host for the purpose of sending and receiving NVMe commands and responses. Each NVMe device presents a buffer that is mapped into host memory using standard PCIe discovery methods. Thereafter, writes to and reads from the buffer are performed by direct memory interface. (Throughout, "incoming buffers" designates a location in a buffer memory storing incoming data, and "outgoing buffers" designates a location in a buffer storing outgoing data.)

As discussed above, RAID requires a set of operations to be performed involving storage devices, memory space and processor cycles to create and maintain error correction information, and in general this has required the provision of a special purpose controller. With the advent of NVMe as a storage protocol, the inventor has discovered that the NVMe devices themselves possess the required resources to perform RAID operations, thus enabling a RAID implementation which dispenses with a separate controller. It is also apparent that the NVMe devices can perform at a pace such that use of a standard controller reduces performance to unacceptable levels, thus providing an additional motivation to dispense with the controller.

An invention is embodied in a data protection system comprising a host; a SSD array, and a PCIe data bus, as follows. The SSD array comprises at least three NVMe drives, each NVMe drive comprising a buffer. The PCIe data bus interfaces the host and the NVMe drives. The NVMe drives are implemented with commands for implementing a RAID volume in the SSD array, wherein the commands are operable to perform RAID operations at the NVMe drives using the buffers of the NVMe drives.

An invention is also embodied in an NVMe drive comprising a buffer and implemented with commands operable to perform RAID operations at the NVMe drive using the buffer of the NVMe drive.

An invention is also embodied in a computer-readable medium encoded with instructions executable by a processor to implement a firmware of an NVMe drive with commands operable to perform RAID operations at the NVMe drive using the buffer of the NVMe drive.

Figure 1:
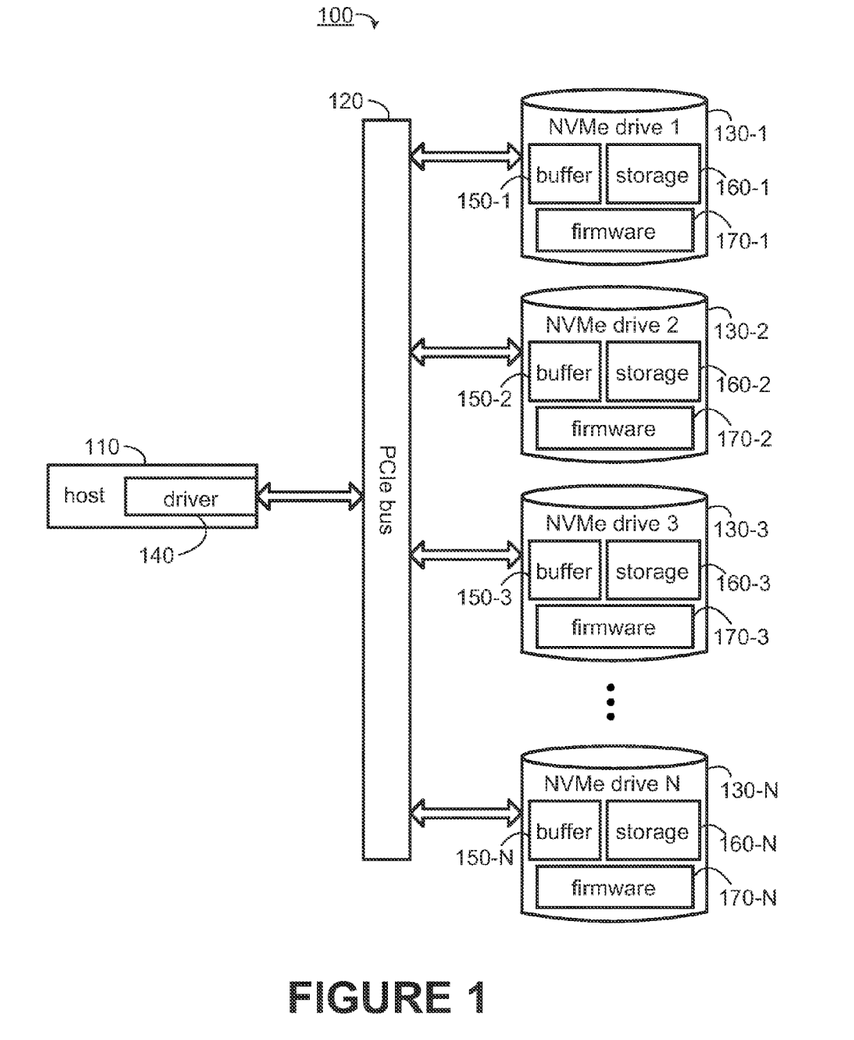
FIG. 1 is a schematic diagram of a data protection system.

Accordingly, a data protection system 100 is shown in FIG. 1. A host 110 interfaces a PCIe bus 120 to connect to a plurality of NVMe drives 130-1, 130-2, 130-3 to 130-N. The host 110 is configured with a host driver 140 which receives commands related to the underlying NVMe drives 130-1, 130-2, 130-3 to 130-N and generates the NVMe commands required to complete the transactions for implementing the RAID or other data protection scheme.

Any number of NVMe drives may be provided in the system 100 so long as a sufficient number of NVMe drives are provided for implementing a desired data protection scheme.

For example, RAID 4 and RAID 5 require a minimum of three drives, while RAID 6 requires a minimum of four drives. Thus, while a system 100 having three NVMe drives 130-1, 130-2, 130-3 shown in FIG. 1 would be sufficient for a RAID 4 or 5 implementation, at least one further NVMe drive would be required for a RAID 6 implementation. Of course, any number of drives may be provided up to any maximum imposed by the particular data protection scheme.

While not part of the NVMe protocol, the space provisions within each NVMe drive make possible the implementation of RAID methods without consuming memory resources within the host.

Using the PCI protocol, the NVMe device presents a memory mapped region of a particular size. The size of this mapped region is programmable. Thus, as each NVMe device is discovered, a respective scratchpad buffer 150-1, 150-2, 150-3 to 150-N and storage 160-1, 160-2, 160-3 to 160-N in each NVMe drive 130-1, 130-2, 130-3 to 130-N is mapped into host memory using standard PCIe discovery methods. For example, each NVMe drive may have 32 GiB of memory and may be configured with an 8 GiB scratchpad buffer, leaving 24 GiB for internal use, though it will be understood that any other convenient sizes may be provided.

While the respective sizes of the scratchpad buffer and storage may be the same for each NVMe drive, they need not be; this allows for the combined use of different generations of NVMe devices having differently-sized buffers and storage in an implementation of the data protection system 100. For example, the buffer 150-1 of NVMe drive 130-1 may have a first size, and the buffer 150-2 of NVMe drive 130-2 may have a second size different from the first size. The buffer 150-3 of NVMe drive 130-3 may have a third size which is the same as either the first size or second size, or may be different from both. The respective storage 160-1, 160-2, 160-3 to 160-N (or generally "media" throughout) of the NVMe drives 130-1, 130-2, 130-3 to 130-N may possess similar relationships, that is they may all having the same size, all having mutually different sizes, or any combination of some having a common size which is different from others.

The host driver 140 builds up memory allocation control structures for each of the drives 130-1, 130-2, 130-3 to 130-N. For example, the host driver 140 may consider the per-device mapped space to be a series of 4 Kib blocks and create allocation bitmaps and spinlocks to manage the buffers. The size allowed for the scratchpad space is a matter of performance and cost requirements, and may be balanced with the needs of the NVMe device to manage resources.

Since the scratchpad buffers 150-1, 150-2, 150-3 to 150-N come from PCIe memory mapped space, they are visible not only to the host 110, but also to the other NVMe drives 130-1, 130-2, 130-3 to 130-N connected via the PCIe bus 120. As such, data moved from one NVMe drive 130-1, 130-2, 130-3 to 130-N to another need not involve transaction with the host 110. Efficiency is gained by allowing memory access directly from one NVMe device to another.

A respective firmware 170-1, 170-2, 170-3 to 170-N of each NVMe drive 130-1, 130-2, 130-3 to 130-N is implemented with NVMe command extensions including transactional controls and RAID operations specifically provided for implementing the data protection scheme. The RAID operations include data translations for erasure code generation and maintenance. The host driver 140 is configured with corresponding support for calling the commands for execution at the NVMe drives. The command extensions are executable, or operable, at each NVMe drive having its firmware encoded or implemented with the command extensions. Each NVMe drive comprises a processor which executes the commands extensions and thereby performs the methods described below.

The transactional controls are a set of operations performed to insure that updates to data and parity are coherent. These are implemented as a combination of I/O and administrative commands for an NVMe drive. While the commands themselves do not prohibit any input/output ("I/O") operation from being performed, their proper application insures that when I/O operations are performed they maintain correct parity with respect to the data at all times.

The controls are expressed as session events. A session defines an exclusive window into some portion of the namespace of an NVMe device. The set of operations may be expressed and conform to the NVMe specification for vendor specific administrative commands.

The transactional controls may include an 'Open Session' command, a 'Close Session' command, a 'Get Next Session' command, and a 'Get Session Details', which are described below in turn.

The 'Open Session' command provides the means to operate exclusively in some range of blocks within a namespace of an NVMe device. The command may receive as parameters a session starting block and a session block count, which together define the session range of blocks (or, alternatively, "block range", or simply "range"), as well as a unique session tag and a session type. The unique session tag enables matching of submission queue entries to completion queue entries. The session type may be either a 'Write Session' or a 'Read Recovery Session', as described below. Status information is returned in the completion queue and may conform to the NVMe specification for vendor unique command completions. Should the range of blocks specified in a particular call of the open session command overlap in any way with the range of blocks specified in any other currently open session, then the Open Session command fails and an error is returned to the caller. In one embodiment, the Open Session command does not wait for the specified range of blocks to be available, but only returns status immediately. In another embodiment, the command waits until the conflicting session is closed. Upon receiving a successful status, a task may operate upon the range of blocks without a conflict with a session of another task.

The 'Close Session' command removes the description of the session from the namespace. The command may receive as parameters a session starting block, a session block count, which together define the range of blocks, and a session tag. If no session over the related range is known an error is returned. Status is returned in the completion queue and may conform to the NVMe specification for vendor unique command completions.

The 'Get Next Session' command enables the caller to query what sessions were in place at some time, for example at the time of some fault. The command may receive as parameters a query starting block and a session tag. Status is returned in the drive completion queue and may conform to the NVMe specification for vendor unique command completions. The command responds with an open session starting block, which is the starting block of the open session in the namespace which is closer to the query starting block, passed in the query, than the starting block of any other open session. The command also responds with a session block count, which, if there is an open session in the namespace, is the number of blocks included in the session. By starting at a query starting block of zero, if there are any sessions open, the one with the smallest starting block number is returned. In one embodiment, by starting at the origin—block zero of the namespace—the task iterates over the namespace and discovers open sessions in order to complete outstanding work. At least two methods of iteration may be used. One method is to use only block zero as the query and to close each session in turn; when all sessions are closed then the completion status shows an error as there are no open sessions. Alternatively, if multiple sessions are to be handled in parallel, then subsequent queries may use as a starting block the sum of the returned open session block and block count, the sum defining a new starting position from which examination for open sessions will proceed.

The 'Get Session Details' command returns state information regarding some open session. The command may receive as parameters a session starting block, a session block count, a session tag, and a session type (Write, or Read Recovery). A session may be in one of two states. It may be 'Reserved' meaning the session was opened but no data has been committed to media, or 'Committed' meaning there has been a commitment of data to the media. The return values may also identify 'Not Currently Open' as status. This would indicate a get was done on a range in the namespace for which there is no session currently open. The command may respond with the session tag used to submit the operation, as well as a status identifying the session state as noted above. For example, the command response status may be set to 01 for 'Reserved', 02 for 'Committed', and any other value indicating that the details are unavailable because there is no open session at this range in the namespace.

As indicated above, a respective firmware 170-1, 170-2, 170-3 to 170-N of each NVMe drive 130-1, 130-2, 130-3 to 130-N is implemented with command extensions including RAID commands for implementing the data protection scheme. The host driver 140 is configured with support for calling and executing the commands.

The command extensions are operable to generate, store, and manage erasure codes for providing data redundancy and error correction. The erasure codes may be generated based on any suitable method as is known in the art. For example, the erasure codes may be generated as simple XOR sums of protected data, in which case the erasure codes may be referenced as parity data or parity information. The erasure codes may alternatively be generated as XOR sums using Galois fields, as Reed-Solomon codes, or as specialized versions of these such as Cauchy-Reed-Solomon or Vandermonde-Reed-Solomon codes.

In the present embodiments, the RAID commands are described as generating erasure codes which are XOR sums, i.e. parity information, according to known methods. It will be understood that the principles set forth herein are equally applicable when using a different method for erasure codes as noted above.

The RAID commands include an 'XWrite' command, an 'XPWrite' command, and an 'XRead' command, which are described below in turn.

Figure 2:
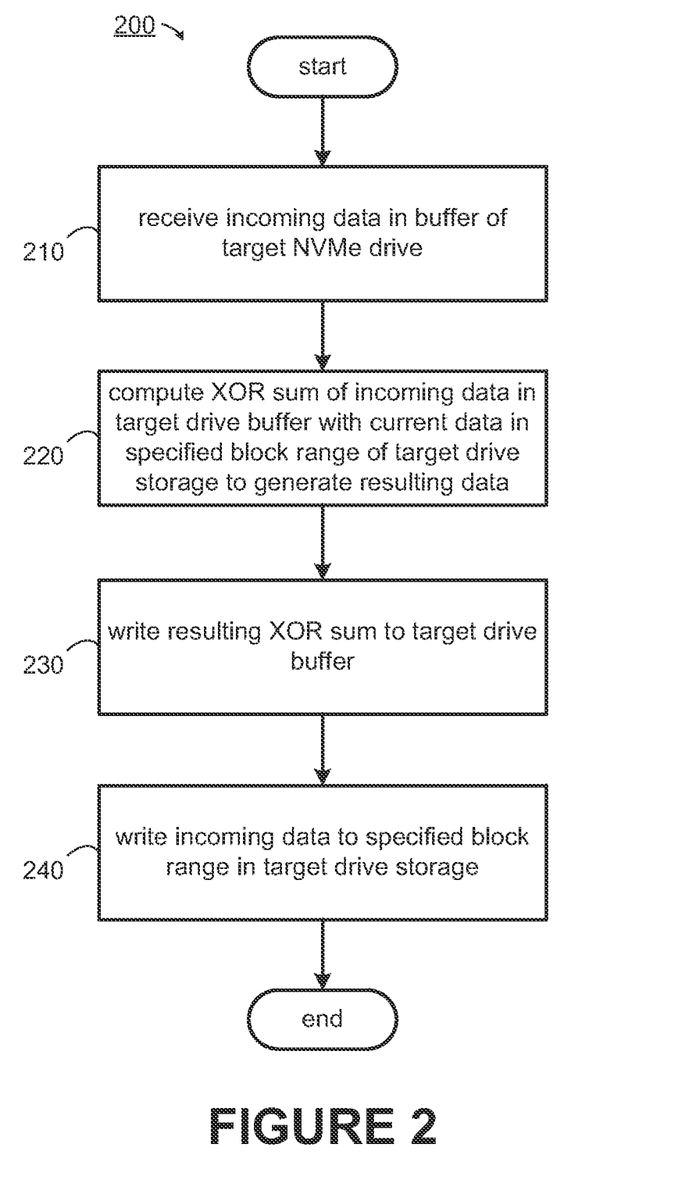
FIG. 2 is a flowchart illustrating an XWrite command.

With reference to FIG. 2, the 'XWrite' command 200 is an XOR-write command. The command may receive as parameters a starting block address, a block count, a list of incoming buffers, and a list of outgoing buffers. The target NVMe device receives incoming data in its buffer (step 210) and is directed to write the data presented in the incoming buffers and in the process of doing so compute an XOR sum of the data with that which is currently in storage (step 220). The device places the resultant XOR sum in the outgoing buffers (step 230) and replaces the on-media data with that in the incoming buffers (step 240).

The NVMe device may transit the session from 'Reserved' to 'Committed' when it has received data for the write and has all resources prepared to move the data to the media.

Figure 3:
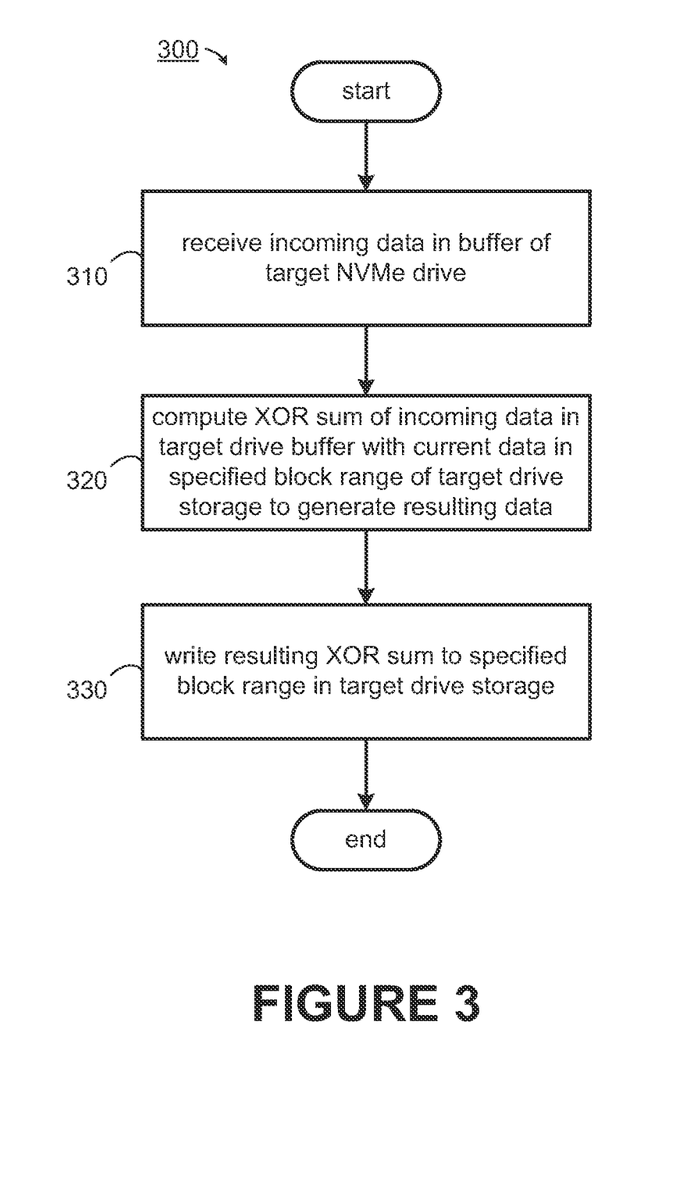
FIG. 3 is a flowchart illustrating an XPWrite command.

With reference to FIG. 3, the 'XPWrite' command 300 is also an XOR-write command. It differs from XWrite in that it returns no data. The command may receive as parameters a starting block address, a block count, and a list of incoming buffers. The NVMe device receives incoming data in its buffer (step 310) is directed to compute an XOR sum of the data presented in the incoming buffers with the data currently on the media (step 320) and write the resultant XOR sum to the media (step 330). The command may use the same NVMe submission queue entry format as a write command. The NVMe device may transit the session from 'Reserved' to 'Committed' when it has received the data for the write and has all resources prepared to move the data to the media.

Figure 4:
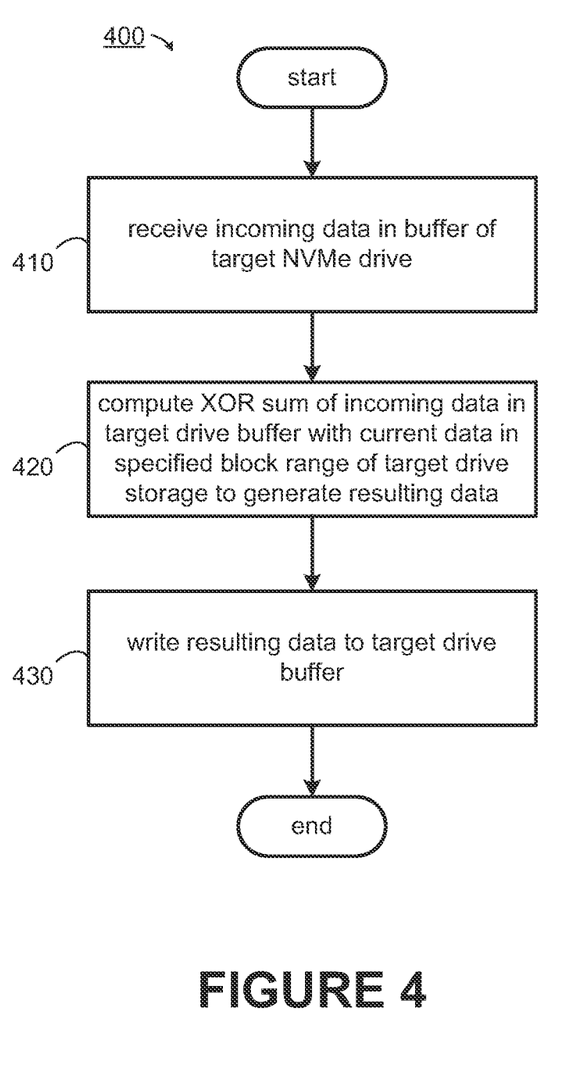
FIG. 4 is a flowchart illustrating an XRead command.

With reference to FIG. 4, the 'XRead' command operates like an XWrite command with the exception that data is not written back to the media. The command may receive as parameters a starting block address, a block count, a list of incoming buffers, and a list of outgoing buffers. The incoming data is received in the buffer of the target drive (step 410), and the XOR sum of the incoming data with the block data read from the media beginning at the starting block address is computed (step 420). The resultant data is written to the outgoing buffers of the drive (step 430).

In the present embodiments, the NVMe command extensions are described as being implemented in respective firmwares of the participating NVMe drives, according to known methods. It will be understood that the principles set forth herein are equally applicable where the commands are encoded or otherwise implemented otherwise than in firmwares of the NVMe drives, and in other embodiments the commands may be hard-coded in one or more application-specified integrated circuit (ASIC) or other component of the NVMe drive controller.

With reference to the foregoing, the system 100 is configured with the following operations for use in providing data protection. In particular the host 110, and even more particularly the host driver 140, are configured with instructions for performing the operations, which include a 'RAID Write' operation, a 'Restart' operation, a 'Read Recovery' operation, and a 'Rebuild Drive' operation described below in turn.

As a preliminary step to the performance of these operations, the firmware of each NVMe drive participating in the data protection method is implemented with the transaction control and RAID command extensions described above. As noted above, as each NVMe device is discovered, the scratchpad buffer may be mapped into host memory using standard PCIe discovery methods. The host driver builds up memory allocation control structures for each of the devices.

The 'RAID Write' operation includes four steps: reading of the old data; reading of the old parity; writing of the new data; and writing of the new parity. These steps are performed in isolation as another, intervening write operation in the same block range would result in improper updates to the parity information. The RAID Write operation may use as parameters a starting block address, a block count, and a list of incoming buffers containing the data to be written. The relative block address in the RAID volume may be translated to the corresponding absolute address on a target drive and parity drive according to known methods.

Figure 5:
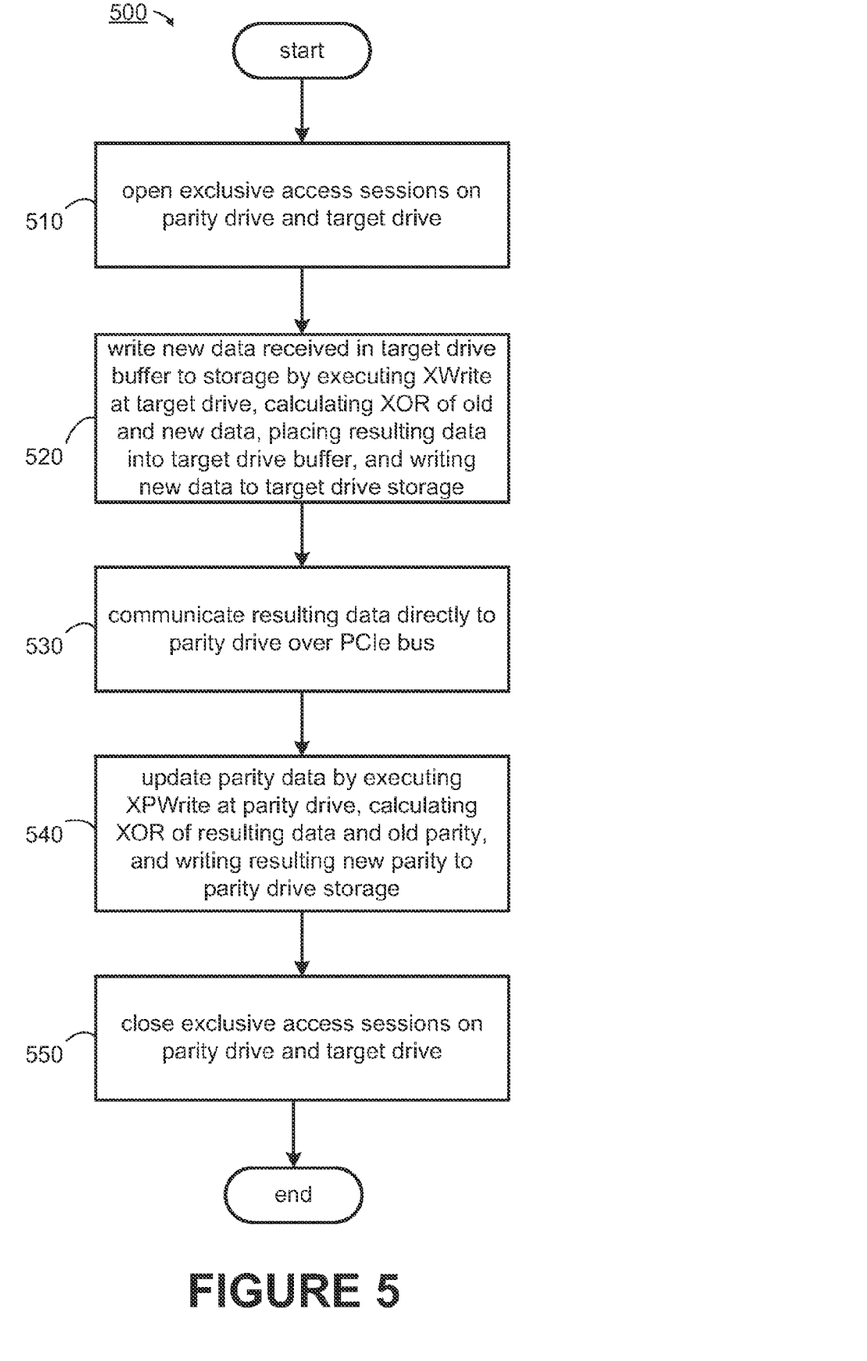
FIG. 5 is a flowchart illustrating a RAID Write operation.

With reference to FIG. 5, in the RAID Write operation 500, a session is opened on the parity drive first, and if the returned status indicates an error, then no session need be opened on the target drive. If a conflicting session is open on the parity drive, the operation may wait until the conflicting session closes. When there is no conflicting session, a session is opened on the parity drive, and then on the target drive (step 510). The new data is written on the target device using the XWrite command which, as described above, writes the new data presented in the incoming buffers to the target drive, and in the process of doing so computes XOR of the new data with the old data currently in storage and places the result in outgoing buffers (step 520). The resulting data is communicated directly over the PCIe bus to the parity drive (step 530). The parity data is then updating by using the XPWrite command, which XOR's the XOR'ed new data and old data received from the outgoing buffers of the target drive directly over the PCIe bus, on the one hand, with the old parity data stored on the parity drive media, and writes the resultant new parity data in the parity drive media (step 540). The session on the parity drive is then closed, followed by the session on the target drive (step 550).

Turning now to the 'Restart' operation, this operation includes discovering all open sessions and completing them. Since RAID cuts a drive into 'chunks' the checking is done for the parity drive for each chunk.

Figure 6:
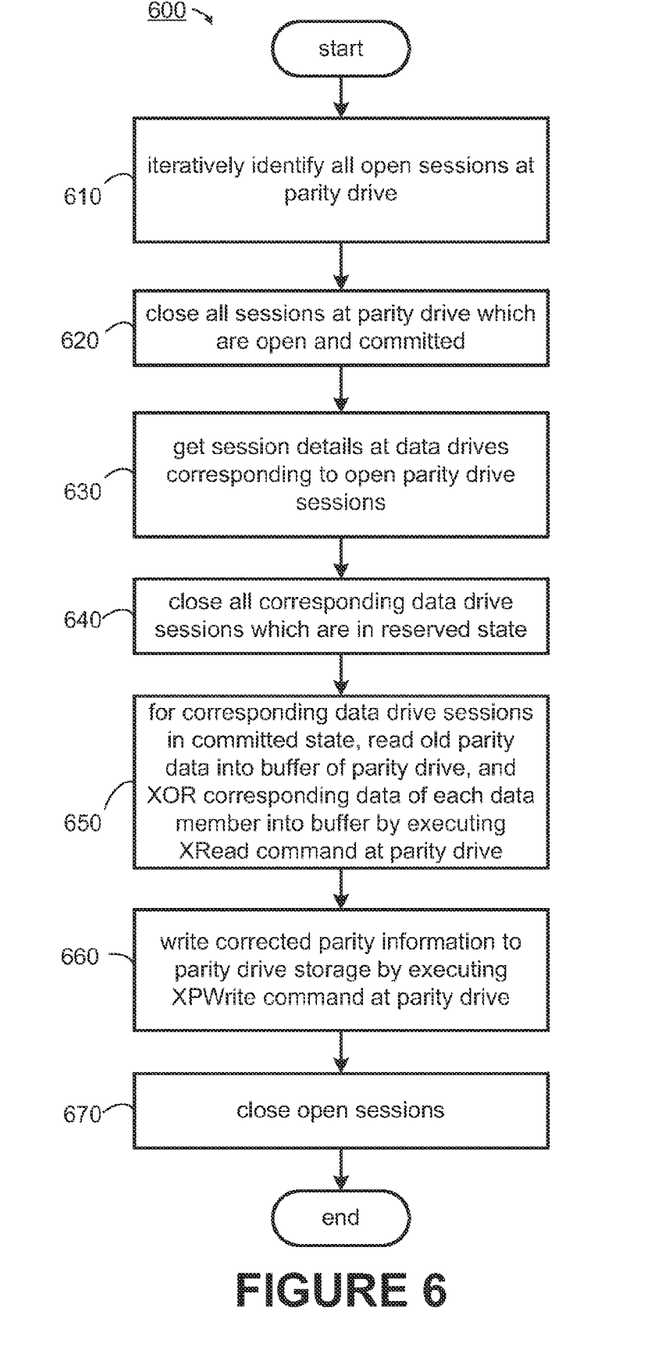
FIG. 6 is a flowchart illustrating a Restart operation.

With reference to FIG. 6, in the Restart operation 600, the Get Next Session command is used iteratively to identify all open sessions on a parity drive (step 610). Open sessions found on the parity drive and which are Committed may be closed (step 620), as the parity information has already been committed to the parity drive media. For any open session found on the parity drive, the Get Session Details command is executed at the corresponding data drive to see what state it is in for that session (step 630). Any open session on a target drive which not Committed (i.e. is Reserved) is one for which no data transfer ever took place; in such case, the session may be closed (step 640). For Committed sessions, work is in progress, and the parity is to be made correct with respect to the corresponding data. In order to do so, the old parity is read into the scratchpad buffer of the parity drive, and then the corresponding data of each data member is XOR'ed into the scratchpad using the XRead command (step 650). The result being is correct parity information, and the buffer is then written to the parity drive using the XPWrite command (step 660), and the sessions are closed (step 670).

Depending on the type of parity information used (e.g. RAID 5, RAID 6, erasure codes), recovery may not be possible. Discovering an open session on a parity drive with no corresponding session on some data drive indicates that not all drives involved in the transaction are still functional. In such case recovery may not be possible. If the number of lost sessions is greater than 'n', the number of error correction codes, then recovery is impossible and data is truly lost.

For example in RAID 5, discovering a session open on a parity drive and no session open on any other drive represents a double failure. RAID 5 tolerates only single failures. This fault may be dealt with in different ways. For example, the whole array may be faulted, or the block may be listed as permanently bad, or placed on some probation list pending some future write. Any suitable recovery method may be employed.

Turning now to the 'Read Recovery' operation, this operation reconstructs data which was stored in a specified block range of a failed drive, from the RAID volume by using stored parity information and the associated data in the remaining data drives, and is a serial process. The operation may include data reads which are made in parallel, and completion of the reconstruction of the corrupted data is done by merging the buffers.

Figure 7:
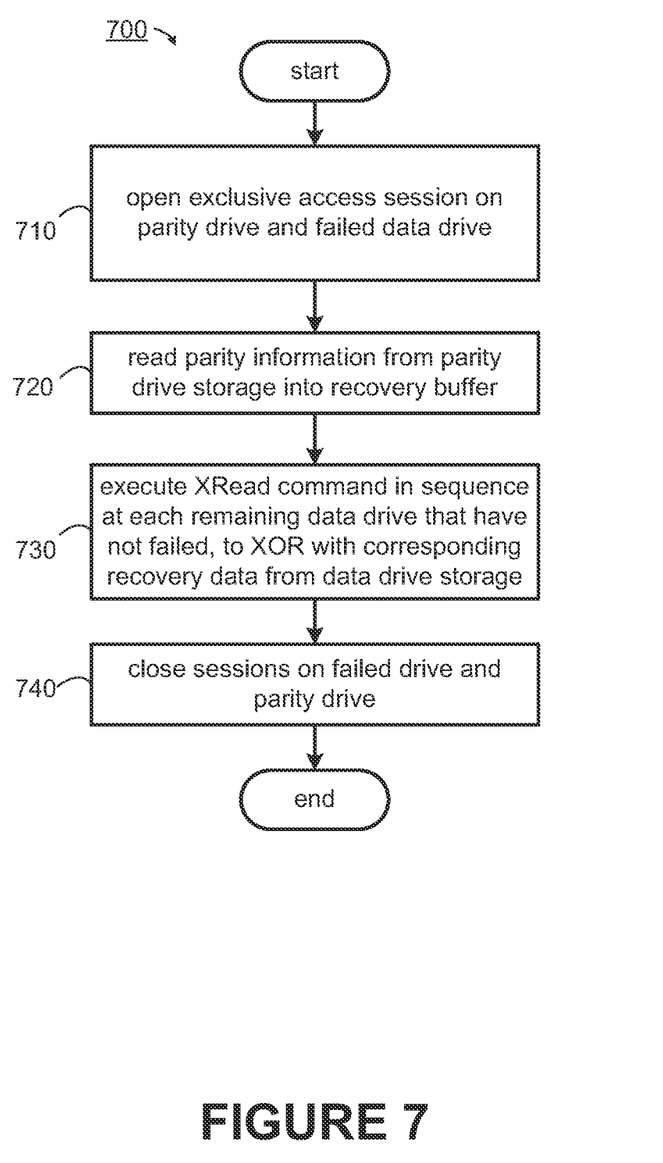
FIG. 7 is a flowchart illustrating a Read Recovery operation.

With reference to FIG. 7, the Read Recovery operation 700 may use as parameters the failed drive identification, a starting block address, and a block count which together are used to determine the address of the corresponding parity information according to known methods. Open Session is used to open a session on the parity drive corresponding to the failed data block range. If the failure is of such a nature that the failed drive responds to the Open Session command, then a session is opened on the failed drive (step 710); otherwise, only a session on the parity drive may be opened. The parity information is then read into a recovery buffer which may be the buffer of the parity drive (step 720). The XRead command is then executed in sequence on each of the remaining drives which have not failed, to read from the drive the corresponding recovery data and XOR it with the content of the recovery buffer. In this way, the corrupted data is reconstructed (step 730). The open sessions are then closed on the failed drive and the parity drive, in that order (step 740).

The above method reconstructs data serially, by rebuilding the data in a step-wise, sequential fashion from the remaining data drives and the parity drive. In other embodiments, improved performance may be achieved by employing a hybrid approach. Since the operations of XOR are commutative, the order of events is immaterial. In other words, failed drive data may be reconstructed by using subsets of the RAID volume in a serialized manner and then combining the outcomes of the subsets. In one embodiment, the buffer is seeded by reading from any one data drive first; in another embodiment, the buffer is first zeroed out.

Figure 8:
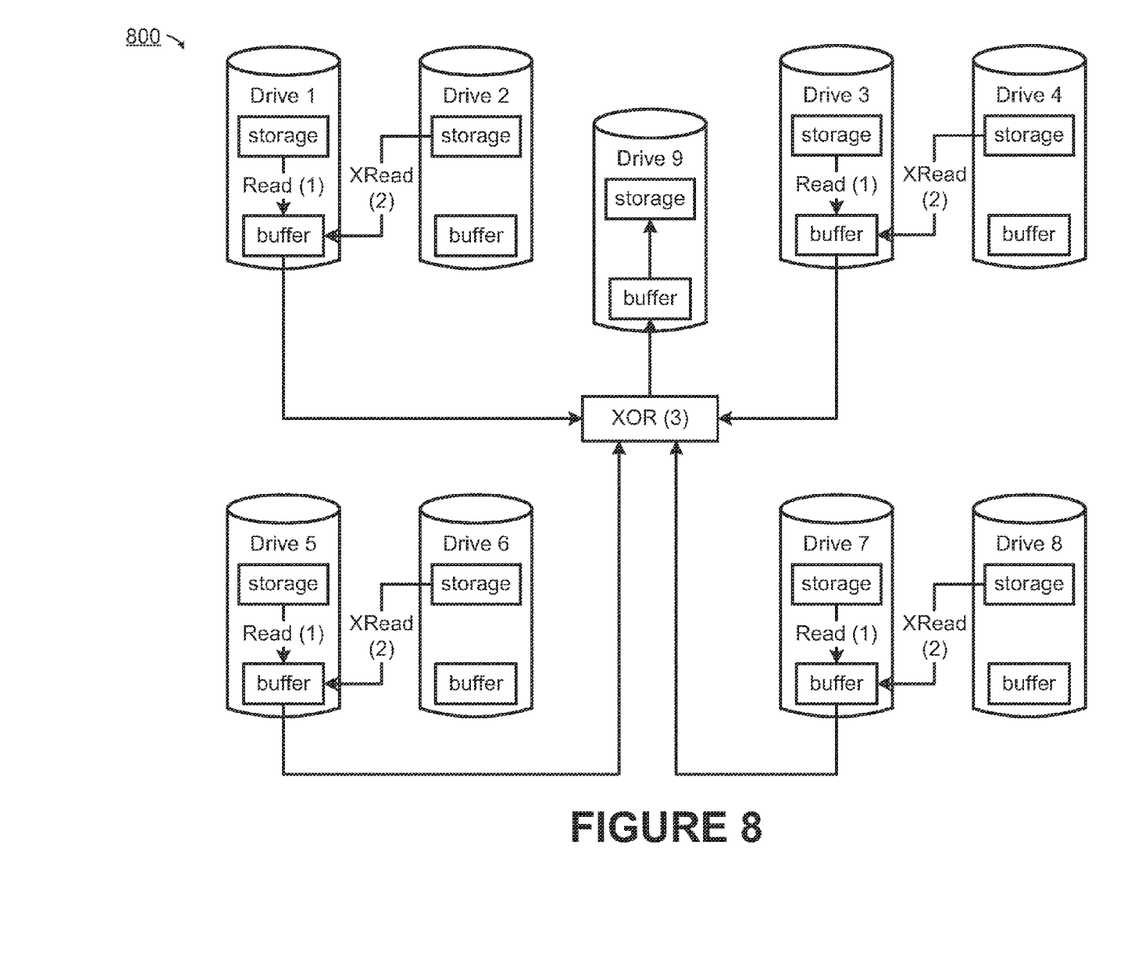
FIG. 8 is a schematic diagram illustrating an embodiment of the Read Recovery operation employing parallel data reconstruction.

As illustrated in FIG. 8, by way of example, recovery of a read from a 9-drive RAID volume configuration 800 may include performing a partial rebuild at each of 4 pairs of drives, and then combining the results to generate the recovered data. Each pair may execute a Read on a first drive of the pair and, upon completion, execute XRead on the second drive of the pair using the same buffer, e.g. the buffer of the first drive in the pair. This results in 4 buffers containing the XOR sum of two corresponding members. XOR'ing those 4 buffers together results in the full XOR sum of what was on the ninth drive. The XOR may be performed on any desired drive inasmuch as all buffers are visible from each NVMe device; in one embodiment, it is performed on the NVMe having the buffer storing the XOR result.

Because the XRead command is implemented in the firmware of each NVMe drive, the partial rebuilds can be performed in parallel. Any suitable arrangement or configuration is possible. Such represents an advantage over the use of a RAID controller which naturally requires serialization. The implementation of the command extensions in all of the cooperating NVMe devices enables cooperative and distributed data reconstruction and other operations.

Turning now to the 'Rebuild Drive' operation, this operation rebuilds the entire data image of a failed drive. While the result of the 'Read Recovery' operation above is simply to return the reconstructed data, the 'Rebuild Drive' operation may be used when a failed drive is replaced with a replacement drive, and the data image is reconstructed using the read recovery methods described above, iterating through all the blocks of the failed drive.

Figure 9:
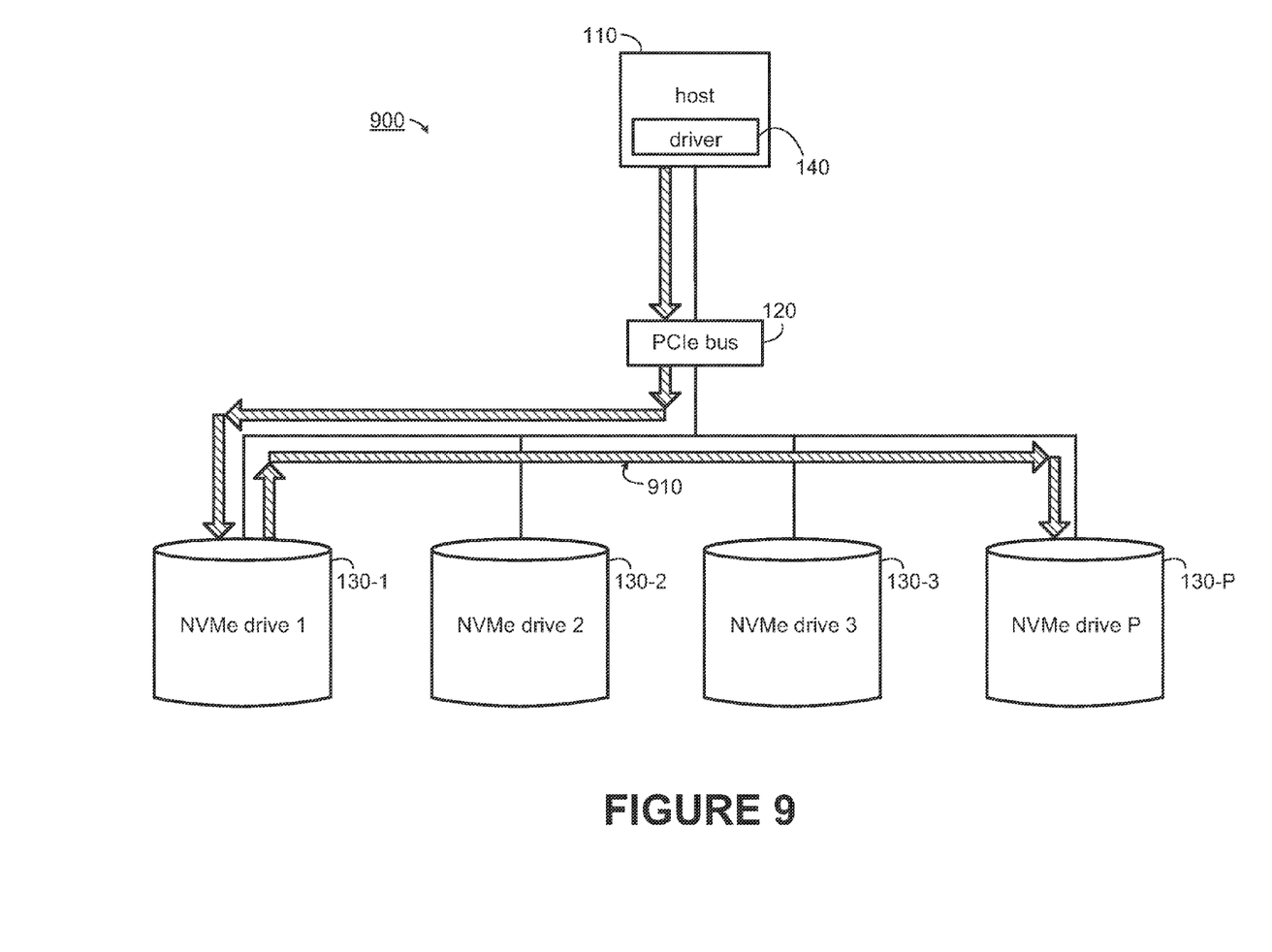
FIG. 9 is a schematic diagram illustrating direct communication of data between NVMe drives over a PCIe bus.

It will be understood that, in performing the above operations, the host need only orchestrate the transactions. The scratchpad buffer needed to perform the generation of parity information is provided by the drives themselves. Furthermore, the parity information need not reside in the host memory at any time as it transits over the PCIe interconnect directly to the target device. By way of example, FIG. 9 shows a schematic diagram 900 of the system 100 performing the RAID Write operation, wherein, as described above, the parity drive 130-P receives directly over the PCIe bus 120 from target drive 130-1 the XOR sum of the new data and old data calculated at target drive 130-1, shown as data flow 910. In general, the NVMe drives 130-1, 130-2, 130-3 to 130-N may communicate with each other directly over the PCIe bus 120 according to methods known in the art, by operation of the command extensions configured in the respective firmware 170-1, 170-2, 170-3 to 170-N.

The ability to employ scratchpad buffers 150-1, 150-2, 150-3 to 150-N on the NVMe drives 130-1, 130-2, 130-3 to 130-N is a departure from host- or controller-based RAID implementations. The method is enabled by the space provisions of the NVMe drives 130-1, 130-2, 130-3 to 130-N, that is, they are capable of presenting memory visible to the host 110 and all other devices on the PCIe bus 120, which means that the attached host 110 need not provide memory resources for management of error correction information.

As discussed above, standard RAID implementations suffer from the disadvantages of limited throughput and the requirement of an additional, external controller. The NVMe-RAID implementations described herein overcome these disadvantages by providing both improved throughput and the ability to dispense with an external controller. NVMe-RAID provides a method to achieve RAID level data protection without greatly reducing the input/output operations per second (IOPS) performance of NVMe devices.

Furthermore, since the generation and maintenance of error recovery information is performed in buffers of the NVMe devices, as opposed to a volatile memory of a separate controller as is the case in a conventional RAID implementation, both the RAID control information and the RAID data protection information persist across power cycles and crashes of the host system.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

In addition, the methods described above may be implemented so as to use alternatively scatter-gather lists, on the one hand, or physical region pages, on the other, as in known in NVMe implementations. In some embodiments, scatter-gather lists are used exclusively, and in this way the limitation of 4 KiB buffer sizes associated with physical region pages may be avoided.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A non-volatile memory express ("NVMe") drive comprising a buffer and implemented with commands operable to perform RAID operations at the NVMe drive using the buffer of the NVMe drive.

2. The NVMe drive according to claim 1 further comprising a firmware implemented with the commands.

3. The NVMe drive according to claim 1, wherein the commands comprise transactional controls executable at the NVMe drive to implement exclusive access sessions in the NVMe drive.

4. The NVMe drive according to claim 1, wherein the commands comprise RAID commands executable at the NVMe drive to generate erasure codes in the buffer of the NVMe drive.

5. The NVMe drive according to claim 4, wherein the erasure codes are exclusive-or (XOR) sums.

6. The NVMe drive according to claim 4, wherein the erasure codes are Reed-Solomon codes.

7. The NVMe drive according to claim 4, wherein the commands are operable to transmit the erasure codes directly from the NVMe drive over a connected PCIe data bus to another NVMe drive.

8. The NVMe drive according to claim 3, wherein the transactional controls comprise:
an open session command for opening an exclusive access session in a specified range of blocks in a namespace of the NVMe drive; and
a close session command for closing a specified open session in the NVMe drive.

9. The NVMe drive according to claim 3, wherein the transactional controls comprise:
a get next session command for querying open sessions in the NVMe drive.

10. The NVMe drive according to claim 3, wherein the transactional controls comprise:
a get session details command for returning state information regarding a specified open session.

11. The NVMe drive according to claim 4, wherein the RAID commands comprise:
an XWrite command executable:
to generate an erasure code based on incoming data in the buffer of the NVMe drive and current data in a specified range of blocks in a namespace of the NVMe drive;
to write the erasure code to the buffer of the NVMe drive; and
to write the incoming data to the specified range of blocks in the namespace of the NVMe drive.

12. The NVMe drive according to claim 4, wherein the RAID commands further comprise:
an XRead command executable:
to generate an erasure code based on incoming data in the buffer of the NVMe drive and current data in a specified range of blocks in a namespace of the NVMe drive using the buffer of the NVMe drive; and
to write the erasure code in the buffer of the NVMe drive.

13. A computer-readable medium encoded with instructions executable by a processor to implement a firmware of a non-volatile memory express ("NVMe") drive with commands operable to perform RAID operations at the NVMe drive using the buffer of the NVMe drive.

* * * * *